(12) United States Patent
Ang et al.

(10) Patent No.: US 9,392,691 B2
(45) Date of Patent: Jul. 12, 2016

(54) MULTI-STACKED ELECTRONIC DEVICE WITH DEFECT-FREE SOLDER CONNECTION

(71) Applicant: International Business Machines Corporation, Armonk, NY (US)

(72) Inventors: Ai Kiar Ang, Singapore (SG); Michael Lauri, Montgomery, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/332,776

(22) Filed: Jul. 16, 2014

(65) Prior Publication Data

US 2016/0021750 A1    Jan. 21, 2016

(51) Int. Cl.
| | | |
|---|---|---|
| H01L 21/44 | (2006.01) |
| H05K 1/11 | (2006.01) |
| H05K 1/18 | (2006.01) |
| H05K 3/32 | (2006.01) |
| H05K 3/34 | (2006.01) |
| H05K 1/14 | (2006.01) |

(52) U.S. Cl.
CPC .................. *H05K 1/11* (2013.01); *H05K 1/144* (2013.01); *H05K 1/18* (2013.01); *H05K 1/181* (2013.01); *H05K 3/328* (2013.01); *H05K 3/3421* (2013.01); *H05K 2201/10015* (2013.01)

(58) Field of Classification Search
CPC ............ H01L 21/4821; H01L 21/4842; H01L 23/49861; H01L 23/49582; H01L 25/043; H01L 25/0657; H01L 25/0756; H01L 25/117
USPC ......................................... 438/123, 124, 109
See application file for complete search history.

(56) References Cited

U.S. PATENT DOCUMENTS

| | | | |
|---|---|---|---|
| 6,166,328 A | 12/2000 | Tandy | |
| 6,410,365 B1 * | 6/2002 | Kawata | ................. H01L 21/565 438/123 |
| 2009/0004783 A1 * | 1/2009 | Lee | ................... H01L 23/49555 438/124 |
| 2013/0120903 A1 * | 5/2013 | Pan | ........................ H01G 9/048 361/306.2 |

OTHER PUBLICATIONS

List of IBM Patents or Patent Applications Treated as Related.

* cited by examiner

*Primary Examiner* — Hung Vu
(74) *Attorney, Agent, or Firm* — Scully, Scott, Murphy & Presser, P.C.; Damion Josephs, Esq.

(57) ABSTRACT

A method includes forming a multi-stacked electronic device having two or more electronic components, each of the electronic components includes a leadframe, the leadframes of each electronic component are physically joined together using a non-solder metal joining process to form a joint, and the joint is located outside a solder connection region.

12 Claims, 3 Drawing Sheets

MULTI-STACKED ELECTRONIC DEVICE WITH DEFECT-FREE SOLDER CONNECTION

BACKGROUND

The present invention generally relates to electronic devices and more particularly to multi-stacked electronic devices having improved solderability.

A multi-stacked electronic device may be formed by two or more electronic components disposed one on top of another. Each electronic component may include leadframes extending from the package. The leadframes are external electrical connections that may allow to join the multi-stacked electronic device to printed circuit boards (PCBs) or other electronic devices. A soldering process may be typically conducted to attach the multi-stacked electronic device via the leadframes to the PCB. Prior to soldering the multi-stacked electronic device to the PCB, a metal joining process may be conducted to physically and electrically connect the leadframes of each electronic component.

The soldering process may generally include melting and flowing a filler or solder metal into a solder joint. Good solderability may be related to wetting by the solder material. When good wetting conditions are achieved, a uniform and adherent coat of solder may fill the solder joint efficiently bonding the multi-stacked electronic device to the PCB. In contrast, if wetting conditions are not satisfactory, poor solderability may be observed causing problems such as dewetting of the solder joint. Dewetting may occur when the solder metal coating a surface withdraws from the solder joint creating irregularly shaped heaps of solder metal separated by areas covered with a thin film of solder metal. Dewetted areas may negatively affect adhesion of the multi-stacked electronic device to the PCB.

SUMMARY

According to an embodiment of the present disclosure, a method includes: forming a multi-stacked electronic device having two or more electronic components, each of the electronic components includes a leadframe, the leadframes of each electronic component are physically joined together using a non-solder metal joining process to form a joint, and the joint is located outside a solder connection region.

According to another embodiment of the present disclosure, a method includes: providing a first electronic component, the first electronic component including a first leadframe, providing a second electronic component, the second electronic component including a second leadframe, placing the first electronic component above and in close proximity with the second electronic component to form a multi-stacked electronic device in a way such that the first and second leadframes partially overlap in a contact region, joining the first leadframe of the first electronic component to the second leadframe of the second electronic component using a non-solder metal joining process to form a joint in the contact region, the joint is located outside a solder connection region including a bottom portion of the first leadframe, and forming a solder connection in the solder connection region, the solder connection attaches the multi-stacked electronic device to a soldering surface.

According to another embodiment of the present disclosure, a structure includes: a multi-stacked electronic device having two or more electronic components, each of the electronic components includes a leadframe, the leadframes of each electronic component are physically joined together by a joint located outside a solder connection region, the solder connection region including a portion of one of the leadframes, a solder connection exists in the portion of one of the leadframes.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
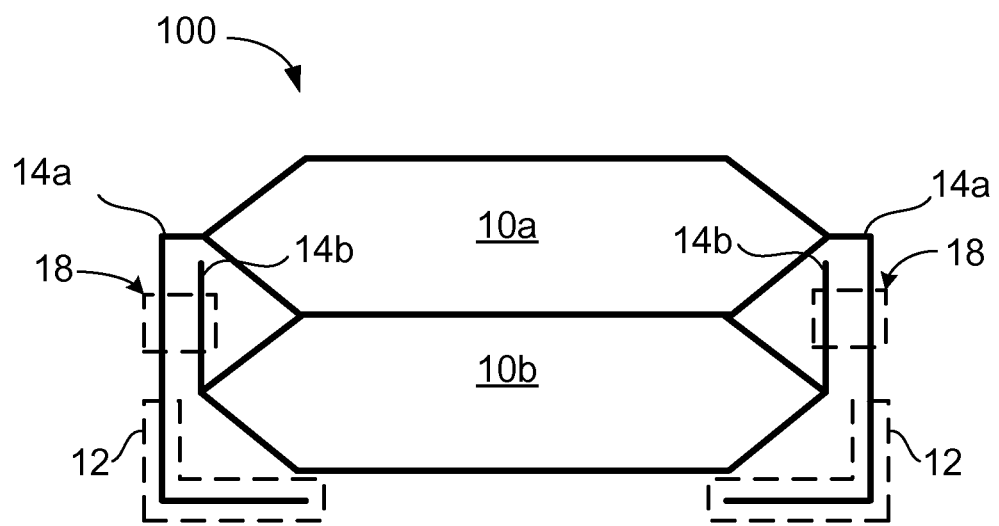
FIG. 1 is a front view of a multi-stacked electronic device depicting a solder connection region, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In current packaging technologies, multiple leadframes extending from the electronic components of a multi-stacked electronic device may be joined together at an area generally located at the lowest portion of the leadframes. This area may correspond with a solder connection region of the multi-stacked electronic device. The solder connection region of the multi-stacked electronic device may include a solderable area by which the multi-stacked electronic device may be attached to, for example, a circuit board. Several problems have been observed when leadframes are joined near the solder connection region, including oxidation of leadframes and solder dewetting which may cause poor bond between the multi-stacked electronic device and the circuit board. It may be desirable or advantageous to move the location of the connection between leadframes from the solder connection region to a location away from the solder connection region of the multi-stacked electronic device. Moving the connection between leadframes away from the solder connection region may improve solderability and improve solder adhesion when soldering the multi-stacked electronic devices to a circuit board.

The present invention generally relates to electronic devices and more particularly to multi-stacked electronic devices having improved solderability. One way to improve solderability may include changing the location of a joint or connection between leadframes to an area located outside a solder connection region of a leadframe of the multi-stacked electronic device. One embodiment by which to improve solderability is described in detail below by referring to the accompanying drawings in FIGS. 1-5.

Figure 2:
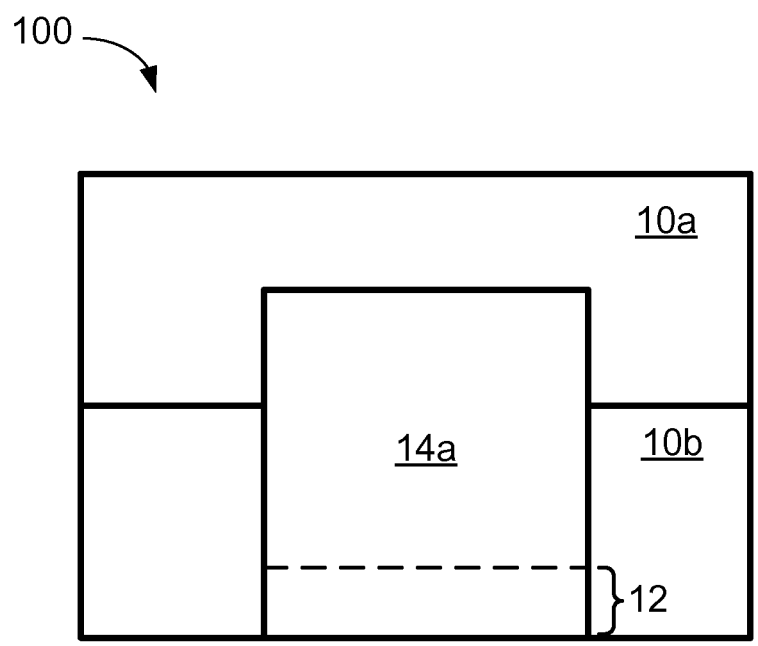
FIG. 2 is a side view of FIG. 1.

Referring now to FIGS. 1-2, a multi-stacked electronic device 100 is formed or provided, according to an embodiment of the present disclosure. FIGS. 1 and 2 are a front view and a side view of the multi-stacked electronic device 100, respectively. The multi-stacked electronic device 100 may be composed of an electronic component 10a vertically stacked on top of another electronic component 10b. The electronic components 10a, 10b may include any electronic component that which may be joined together in multiples and subsequently soldered to a circuit board. Examples of electronic components may include stacked semiconductors, capacitors, resistors, inductors or hybrid combination. In an embodiment, the electronic components 10a, 10b may each be a tantalum capacitor. It should be noted that while only two electronic components are depicted in the figure, the multi-stacked electronic device 100 may include any number of electronic devices arranging in any imaginable configuration.

The electronic component 10a may include a leadframe 14a, while the electronic component 10b may include a leadframe 14b. The leadframes 14a, 14b may provide a metallized surface capable of withstanding a subsequent non-solder metal joining process, including, but not limited to, welding or brazing. The leadframes 14a, 14b may extend from each of the electronic components 10a, 10b, respectively. In some embodiments, the leadframes 14a, 14b may include preplated copper leadframes, preplated iron leadframes, preplated alloy 42 leadframes or bare metal leadframes.

The multi-stacked electronic device 100 may include a solder connection region 12 by which the multi-stacked electronic device 100 may be attached to, for example, a circuit board or another electronic device. In the depicted embodiment, the solder connection region 12 is located on a bottom portion of the leadframe 14a of the electronic component 10a. In one embodiment, the solder connection region 12 may extend from a bottom portion of the leadframe 14a up to approximately ⅓ of a height of the leadframe 14a. In another embodiment, the solder connection region 12 may extend from the bottom portion of the leadframe 14a up to approximately ¼ of the height of the leadframe 14a. In a preferred embodiment, the solder connection region 12 of the multi-stacked electronic device 100 may include any area of the leadframe 14a as defined by a supplier's specification. It should be noted that the solder connection region 12 may generally be defined by an area of the leadframe which becomes fully wetted by solder during subsequent soldering and attachment of the multi-stacked package 100 to a circuit board. Therefore, the various heights of the solder connection region 12 disclosed above may depend on how far the solder wets or wicks up the leadframe.

In the depicted embodiment, the leadframe 14a may extend from the electronic component 10a down to the solder connection region 12, and the leadframe 14b of the electronic component 10b may extend upward and may at least partially overlap the leadframe 14a of the electronic component 10a. This configuration may allow joining the leadframes 14a, 14b in a contact region 18 located above the solder connection region 12 of the leadframe 14a. It should be noted that in typical stacking configurations, both leadframes 14a, 14b may extend downwards and joined in the solder connection region 12. Moving the location of the contact region 18 to an area above the solder connection region 12 may reduce or eliminate wettability problems described above and improve solderability of the multi-stacked electronic device 100.

Figure 3:
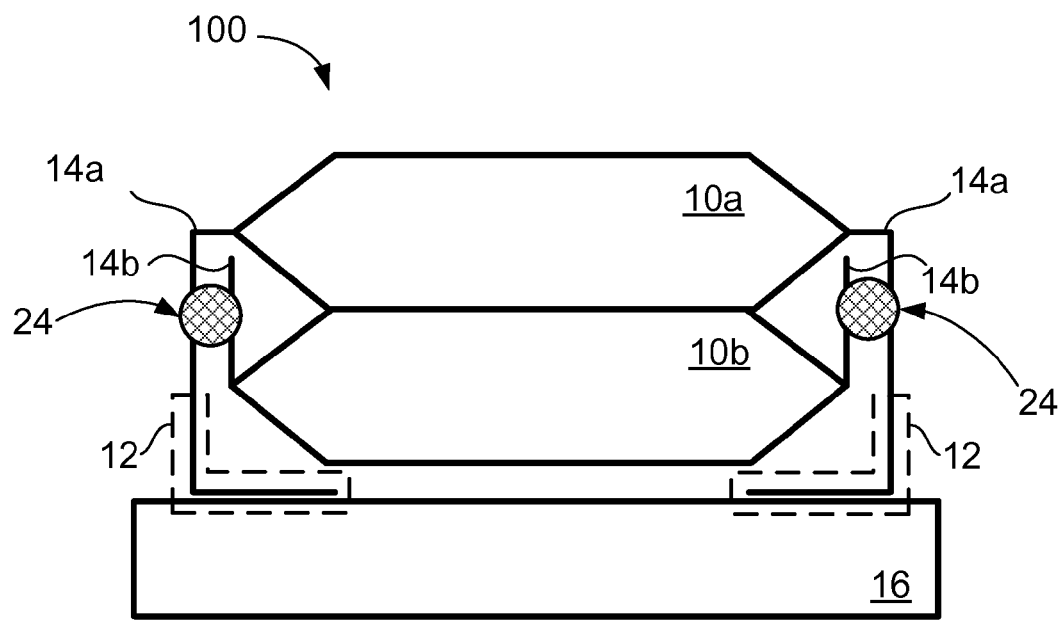
FIG. 3 is a front view of the multi-stacked electronic device depicting forming a joint outside the solder connection region, according to an embodiment of the present disclosure.
Figure 4:
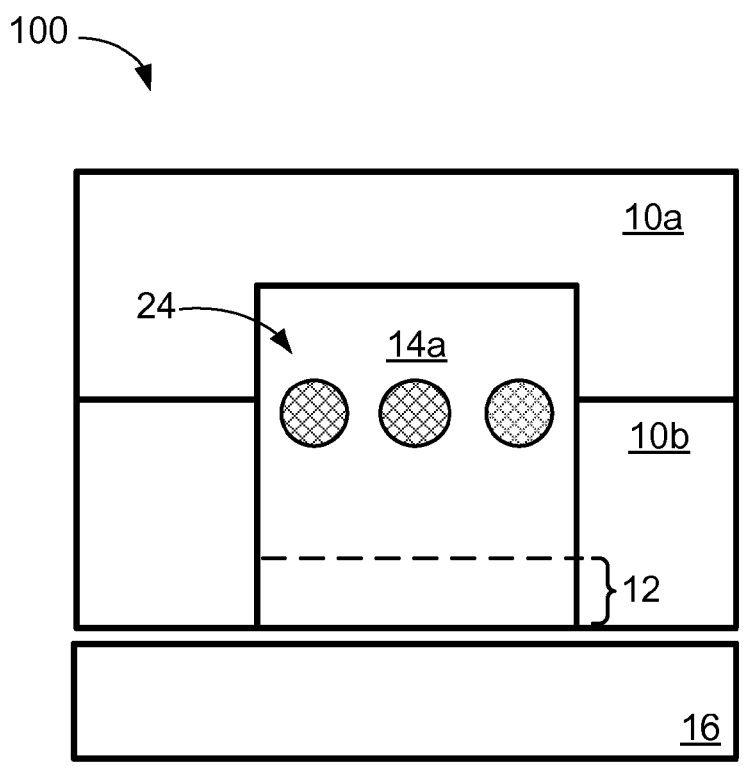
FIG. 4 is a side view of FIG. 3.

Referring now to FIGS. 3-4, a non-solder metal joining process may be conducted to form a joint 24 between the leadframes 14a, 14b. The metal joining process may include, for example, brazing or welding of the leadframes 14a, 14b together in the contact region 18 (FIG. 1). In one embodiment, the joint 24 may include a spot weld.

At this point of the manufacturing process, a soldering surface 16 may be formed or provided. In one embodiment, the soldering surface 16 may be, for example, a multilayered printed circuit board (PCB) consisting of an epoxy dielectric material with a metal foil (such as copper) on its upper and lower surfaces. In another embodiment, the soldering surface 16 may include a PCB, a circuit board, a laminate substrate, or other electronic device.

After joining the leadframes 14a, 14b together in the contact region 18 (FIG. 1), the multi-stacked electronic device 100 may be placed on the soldering surface 16 and a soldering process may be used to attach the multi-stacked electronic device 100 to the soldering surface 16. More specifically, a portion of the leadframe 14a within the solder connection region 12 may be joined to the soldering surface 16 with a solder connection. In doing so, solder may not wet above the solder connection region 12, which means the resulting solder connection will not be contaminated by the joint 24. The soldering process may include melting and flowing a filler metal or solder in the solder connection region 12. Preferably, in all cases, the solder may exhibit a lower melting point than either the join 24 or any of the adjoining metals. In one exemplary embodiment, the solder may include a lead free solder.

Figure 5:
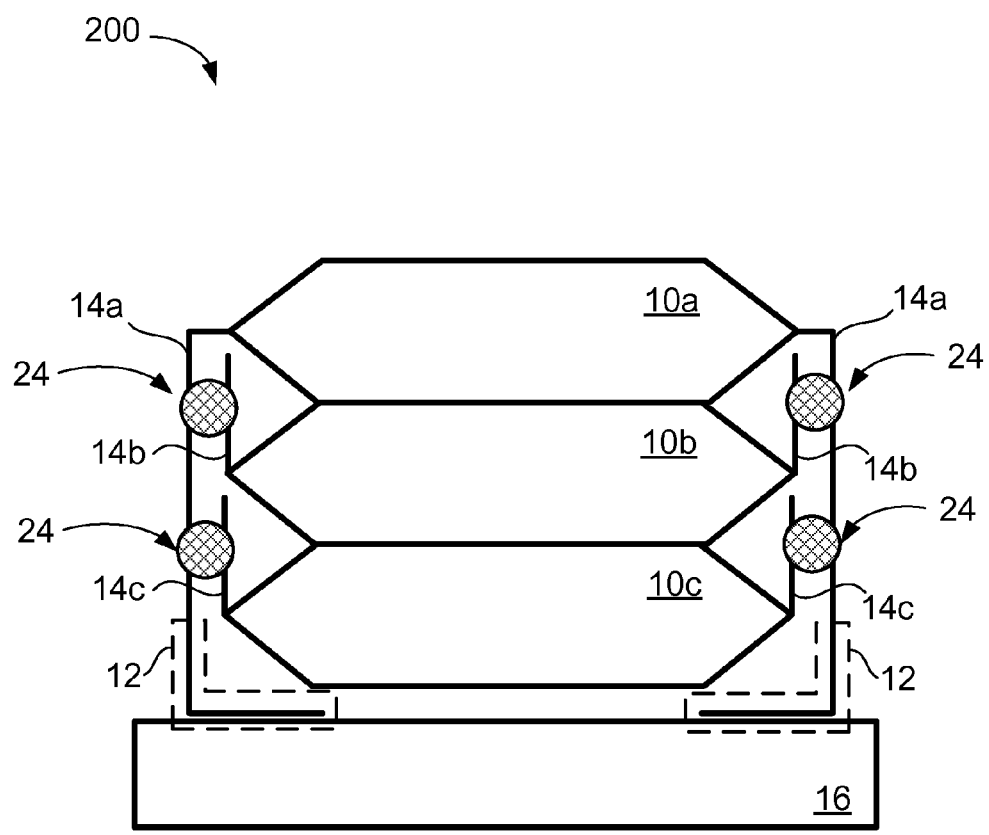
FIG. 5 is a front view of a multi-stacked electronic device depicting forming joints outside the solder connection region, according to an embodiment of the present disclosure.

Referring now to FIG. 5, a multi-stacked electronic device 200 is shown, according to an embodiment of the present disclosure. The multi-stacked electronic device 200 may be composed of electronic components 10a, 10b and 10c which may be vertically stacked one on top of another. In this embodiment, the leadframe 14a may extend from the electronic component 10a down to the solder connection region 12, the leadframe 14b of the electronic component 10b may extend up and may at least partially overlap the leadframe 14a, and the leadframe 14c of the electronic component 10c may extend up and may also at least partially overlap the leadframe 14a of the electronic component 10a. Subsequently joints 24 may be formed on the overlapping regions between leadframes to physically connect the leadframes 14a, 14b and 14a, 14c. As may be observed, the joints 24 are positioned above the solder connection region 12 of the multi-stacked electronic device 200 to prevent solderability issues discussed above.

Therefore, by changing the location of the joint 24, and moving it from the bottom of the leadframes in the solder connection region 12 to a contact region 18 (FIG. 1) located above the solder connection region 12, leadframes oxidation and solder dewetting may be prevented thereby reducing the presence of areas with poor solderability in the solder connection region 12, this may in turn improved adhesion of the multi-stacked electronic device 100 to the soldering surface 16. By preventing solder dewetting, unbonded areas or defective solder joints may be reduced improving overall component reliability, meeting soldering quality standards, and decreasing rework and manufacturing delays.

What is claim is:

1. A method comprising:
    forming a stacked electronic device having at least first and second electronic components, the first electronic component including a lateral, outside downwardly extending first leadframe, the second electronic component including a lateral, upwardly extending second leadframe, the second leadframe extending upwardly, laterally inside of, and vertically overlapping with, the first leadframe, wherein the first and second leadframes include respective vertically overlapping portions, and the first leadframe including a lower portion spaced from said overlapping portions and defining a solder connection region for soldering the stacked electronic device to a soldering surface,
    the forming a stacked electronic device including using a non-solder metal joining process to form a joint directly between and physically joining together the overlapping portions of the first and second leadframes, wherein the joint is located outside the solder connection region.

2. The method of claim 1, wherein
    the first electronic component is an upper most electronic component, and the second electronic component is a lowermost electronic component, and
    the leadframe of the uppermost electronic component extends from the uppermost electronic component downwards to the solder connection region, and the leadframe of the lowermost electronic component extends upwards and at least partially overlaps the leadframe of the uppermost electronic component.

3. The method of claim 1, wherein the non-solder metal joining process comprises brazing or welding the leadframes together.

4. The method of claim 1, wherein the solder connection region comprises a predefined solderable area.

5. The method of claim 1, further comprising:
    attaching the stacked electronic device to a soldering surface.

6. The method of claim 1, wherein the leadframe of the first electronic component is directly connected to the soldering surface, and the leadframes of any additional electronic component are directly joined to the leadframe of the more first electronic component that is directly connected to the soldering surface.

7. The method of claim 1, wherein the soldering surface comprises a circuit board, a PCB, laminate substrate, or other electronic device.

8. A method comprising:
    providing a first electronic component, the first electronic component comprising a lateral, outside, downwardly extending, first leadframe;
    providing a second electronic component, the second electronic component comprising a lateral, upwardly extending second leadframe;
    placing the first electronic component above and in close proximity with the second electronic component to form a stacked electronic device, wherein the second leadframe extends upwardly, laterally inside of, and vertically overlapping with, the first lead frame, wherein the first and second leadframes include vertically overlapping portions in a contact region, and the first leadframe includes a lower portion spaced from said overlapping portions and defining a solder connection region for soldering the stacked electronic device to a soldering surface;
    joining the first leadframe of the first electronic component to the second leadframe of the second electronic component using a non-solder metal joining process to form a joint in the contact region directly between and physically joining together the overlapping portions of the first and second leadframes, wherein the joint is located outside the solder connection region; and
    forming a solder connection in the solder connection region, wherein the solder connection attaches the multi-stacked electronic device to the soldering surface.

9. The method of claim 8, wherein the non-solder metal joining process comprises brazing or welding the first leadframe and the second leadframe together.

10. The method of claim 8, wherein the solder connection region comprises a predetermined solderable area.

11. The method of claim 8, wherein the first electronic component and the second electronic component comprise tantalum capacitors.

12. The method of claim 8, wherein the soldering surface comprises a circuit board, a laminate substrate, or other electronic device.

* * * * *